US012787726B2

(12) United States Patent
Mizomoto et al.

(10) Patent No.: US 12,787,726 B2
(45) Date of Patent: Nov. 3, 2026

(54) SUBSTRATE PROCESSING METHOD AND SUBSTRATE PROCESSING APPARATUS

(71) Applicant: Tokyo Electron Limited, Tokyo (JP)

(72) Inventors: Yasutaka Mizomoto, Kikuchi-gun (JP); Yohei Yamashita, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 407 days.

(21) Appl. No.: 18/689,484

(22) PCT Filed: Aug. 26, 2022

(86) PCT No.: PCT/JP2022/032169
§ 371 (c)(1),
(2) Date: Mar. 6, 2024

(87) PCT Pub. No.: WO2023/032833
PCT Pub. Date: Mar. 9, 2023

(65) Prior Publication Data

US 2024/0355669 A1 Oct. 24, 2024

(30) Foreign Application Priority Data

Sep. 6, 2021 (JP) ................................ 2021-145022
Dec. 9, 2021 (JP) ................................ 2021-200094

(51) Int. Cl.
*H10P 90/00* (2026.01)
*H10P 52/40* (2026.01)
(Continued)

(52) U.S. Cl.
CPC ........ *H10P 90/1908* (2026.01); *H10P 52/402* (2026.01); *H10P 72/0428* (2026.01); *H10P 90/1916* (2026.01); *H10W 10/181* (2026.01)

(58) Field of Classification Search
CPC ......... B23K 26/53; H10P 95/00; H10P 10/12; H10P 72/0422; H10P 72/3218;
(Continued)

(56) References Cited

U.S. PATENT DOCUMENTS

2005/0048738 A1* 3/2005 Shaheen ................ B23K 26/18
257/E21.568
2020/0365462 A1* 11/2020 Iwasawa ............ B23K 26/0006

FOREIGN PATENT DOCUMENTS

JP 2011-097105 A 5/2011

OTHER PUBLICATIONS

International Search Report of PCT/JP2022/032169 dated Nov. 1, 2022.

* cited by examiner

*Primary Examiner* — Fazli Erdem
(74) *Attorney, Agent, or Firm* — Shih IP Law Group, PLLC.

(57) ABSTRACT

A substrate processing method of processing a combined substrate in which a first substrate and a second substrate are bonded to each other is provided. A device layer including multiple devices is formed on a front surface side of the first substrate. The substrate processing method includes forming a light leakage prevention layer by radiating first laser light to an oxygen-containing film formed between the device layer and a position where a modification layer serving as a starting point for separation of the first substrate is formed; forming the modification layer by radiating second laser light to an inside of the first substrate after the forming of the light leakage prevention layer; and separating the first substrate starting from the modification layer to thin the first substrate.

17 Claims, 9 Drawing Sheets

(51) Int. Cl.
*H10P 72/00* (2026.01)
*H10W 10/10* (2026.01)

(58) Field of Classification Search
CPC ............. H10P 72/7618; H10P 72/7624; H10P 50/287; H10P 52/00
See application file for complete search history.

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2022/032169 filed on Aug. 26, 2022, which claims the benefit of Japanese Patent Application No. 2021-145022 filed on Sep. 6, 2021 and Japanese Patent Application No. 2021-200094 filed on Dec. 9, 2021, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a method of manufacturing a semiconductor device by using a SIMOX (Separation by Implanted Oxygen) substrate. According to the disclosure of Patent Document 1, after a layer including a memory element and a field effect transistor with a first single crystalline semiconductor layer as an active layer is formed on one surface of the SIMOX substrate, a second single crystalline semiconductor layer formed on a surface opposite to the one surface is removed by at least one of etching or grinding/polishing.

Non-patent Document 1: Japanese Patent Laid-open Publication No. 2011-097105

SUMMARY

In an exemplary embodiment, a substrate processing method of processing a combined substrate in which a first substrate and a second substrate are bonded to each other is provided. A device layer including multiple devices is formed on a front surface side of the first substrate. The substrate processing method includes forming a light leakage prevention layer by radiating first laser light to an oxygen-containing film formed between the device layer and a position where a modification layer serving as a starting point for separation of the first substrate is formed; forming the modification layer by radiating second laser light to an inside of the first substrate after the forming of the light leakage prevention layer; and separating the first substrate starting from the modification layer to thin the first substrate.

DETAILED DESCRIPTION

Figure 1:
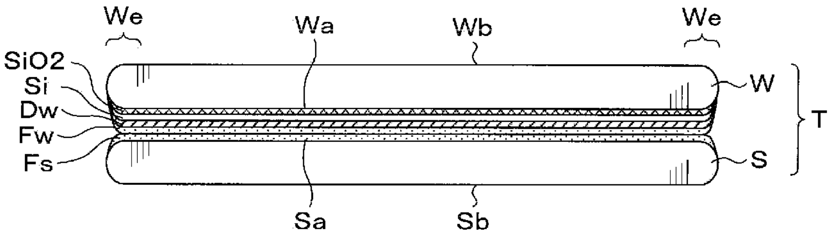
FIG. 1 is a side view illustrating an example structure of a combined wafer.

In a manufacturing process for a semiconductor device, a semiconductor substrate (hereinafter, sometimes referred to as "wafer") on a surface of which a device layer including a plurality of electronic circuits and the like is formed is thinned. For example, the thinning of the wafer is performed by radiating laser light to an inside of the wafer as a processing target to form a modification layer, and then separating the wafer into a device wafer on a front side and a separation wafer on a rear side, starting from the modification layer.

Recently, for the purpose of improving an efficiency of a semiconductor device (transistor) as a product, a SOI (Silicon on Insulator) substrate in which a single crystalline semiconductor layer (for example, single crystalline silicon) and an insulating layer (for example, $SiO_2$) are stacked may be used. An example of this SOI substrate is the SIMOX substrate described in Patent Document 1. When the SOI substrate is used, it is possible to reduce parasitic capacitance of the transistor, thus increasing an operating speed while reducing power consumption.

However, when using the SOI substrate in this way, it has been difficult to appropriately perform the above-described thinning of the wafer.

Specifically, when the wafer is thinned by etching as described in Patent Document 1, for example, it takes time to thin the wafer, and it is necessary to use a chemical liquid and a gas in large amounts.

Further, when grinding and polishing the wafer as described in Patent Document 1, for example, a large amount of grinding water is required to thin the wafer, and a large amount of grinding debris is generated during the grinding.

Besides, when forming the modification layer inside the wafer as described above, there is a risk that radiated laser light, for example, near infrared (NIR) light may penetrate the single crystalline semiconductor layer and the insulating layer, causing a light leakage to affect the device layer.

Here, as a way to suppress the influence of the light leakage on the device layer, a focus (a position where the modification layer is formed) of the laser light inside the wafer is shifted upwards (to the rear side opposite to the front side where the device layer is formed), the light heading toward the device layer may be defocused. In this case, however, as the formation position of the modification layer is shifted upwards, a position of a separation surface (thinning interface) of the wafer is also shifted upwards, which may cause an increase in a grinding amount of a rear surface of the wafer in a post-process.

In view of the foregoing, exemplary embodiments of the present disclosure provide a technique capable of appropriately thinning a first substrate in a combined substrate in which the first substrate and a second substrate are bonded to each other. Hereinafter, a wafer processing system as a substrate processing apparatus and a wafer processing method as a substrate processing method according to an exemplary embodiment will be described with reference to the accompanying drawings. In the present specification and the drawings, parts having substantially the same functions and configurations will be assigned same reference numerals, and redundant description will be omitted.

A wafer processing system 1 according to the present exemplary embodiment, which will be described later in detail, performs a processing on a combined wafer T as a combined substrate in which a first wafer W as a first substrate and a second wafer S as a second substrate are bonded to each other as shown in FIG. 1. Hereinafter, in the first wafer W, a surface to be bonded to the second wafer S will be referred to as a front surface Wa, and a surface opposite to the front surface Wa will be referred to as a rear surface Wb. Likewise, in the second wafer S, a surface to be bonded to the first wafer W will be referred to as a front surface Sa, and a surface opposite to the front surface Sa will be referred to as a rear surface Sb.

The first wafer W is, for example, a semiconductor wafer such as a silicon substrate. A $SiO_2$ film as an insulating layer is formed on the front surface Wa of the first wafer W. For example, the $SiO_2$ film may be an oxygen-doped silicon layer which is formed as a part of the thickness of the first wafer W is modified by doping of oxygen ($O_2$). A Si film as a single crystalline silicon layer (single crystalline semiconductor layer) and a device layer Dw including a plurality of devices are further formed in the $SiO_2$ film. That is, the first wafer W has a structure as an SOI substrate in which the insulating layer and the single crystalline semiconductor layer are stacked. Further, a surface film Fw is further formed in the device layer Dw, and the first wafer W is bonded to the second wafer S with the surface film Fw therebetween. The surface film Fw may be, by way of non-limiting example, an oxide film (a THOX film, a $SiO_2$ film, or a TEOS film), a SiC film, SiCN film, or an adhesive. Further, a peripheral portion We of the first wafer W is chamfered, and the thickness of the peripheral portion We decreases as it goes toward a leading end thereof when viewed on a cross section thereof.

Furthermore, the $SiO_2$ film formed on the first wafer W does not necessarily need to be the oxygen-doped silicon layer, and may be a general oxide film. The $SiO_2$ film may be formed by modifying an inside of the first wafer W, or may be formed so as to coat an outer surface of the first wafer W. In other words, the first wafer W is provided with the oxygen-containing film.

The second wafer S is, for example, a wafer that supports the first wafer W. A surface film Fs is formed on the second wafer S, and the second wafer S is bonded to the first wafer W with the surface film Fs therebetween. Further, the second wafer S does not need to be the support wafer that supports the first wafer W, and may be, for example, a device wafer having a device layer (not shown) formed on the front surface Sa thereof. In this case, the surface film Fs is formed on the second wafer S with the device layer therebetween.

Figure 2:
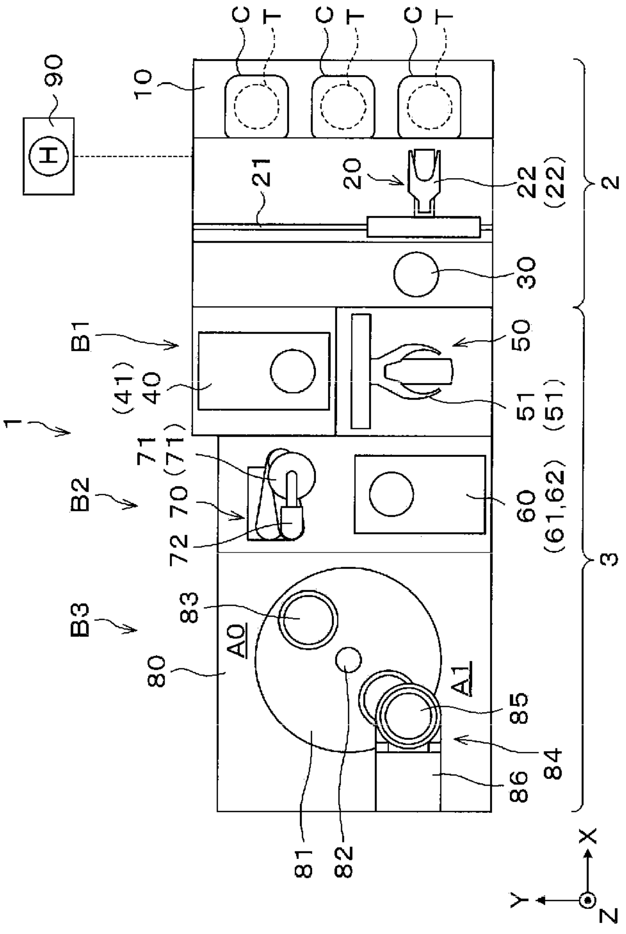
FIG. 2 is a plan view schematically illustrating a configuration of a wafer processing system according to an exemplary embodiment.

As shown in FIG. 2, the wafer processing system 1 has a configuration in which a carry-in/out station 2 and a processing station 3 are connected as one body. In the carry-in/out station 2, a cassette C capable of accommodating a plurality of combined wafers T therein is carried to/from the outside, for example. The processing station 3 is equipped with various kinds of processing apparatuses each configured to perform a required processing on the combined wafer T.

The carry-in/out station 2 is equipped with a cassette placing table 10 configured to place a plurality of, for example, three cassettes C thereon. Further, a wafer transfer device 20 is provided adjacent to the cassette placing table 10 on the negative X-axis side of the cassette placing table 10. The wafer transfer device 20 is configured to be moved on a transfer path 21 extending in the Y-axis direction to transfer the combined wafer T between the cassette C of the cassette placing table 10 and a transition device 30 to be described later.

In the carry-in/out station 2, the transition device 30 configured to deliver the combined wafer T to/from the processing station 3 is disposed on the negative X-axis side of the wafer transfer device 20 to be adjacent to the wafer transfer device 20.

The processing station 3 is equipped with, for example, three processing blocks B1 to B3. The first processing block B1, the second processing block B2, and the third processing block B3 are arranged in this order from the positive X-axis side (carry-in/out station 2 side) toward the negative X-axis side.

The first processing block B1 includes an etching device 40 configured to etch a ground surface of the first wafer W ground in a processing device 80 to be described later, a cleaning device 41 configured to clean the ground surface of the first wafer W, and a wafer transfer device 50. The etching device 40 and the cleaning device 41 are stacked on top of each other. Here, the number and the layout of the etching device 40 and the cleaning device 41 are not limited to the shown example.

The wafer transfer device 50 is disposed on the negative X-axis side of the transition device 30. The wafer transfer device 50 has, for example, two transfer arms 51 each configured to hold and transfer the combined wafer T. Each transfer arm 51 is configured to be movable in a horizontal direction and a vertical direction and pivotable around a horizontal axis and a vertical axis. The wafer transfer device 50 is configured to be able to transfer the combined wafer T or the like to the transition device 30, the etching device 40, the cleaning device 41, an interface modifying device 60 to be described later, an internal modifying device 61 to be described later, and a separating device 62 to be described later.

The second processing block B2 is equipped with the interface modifying device 60 configured to form a light leakage prevention layer to be described later, the internal modifying device 61 configured to form a separation surface modification layer that serves as a starting point for separation of the first wafer W, the separating device 62 configured to separate the first wafer W, and a wafer transfer device 70. The interface modifying device 60, the internal modifying device 61, and the separating device 62 are stacked on top of each other. Here, the number and the layout of the interface modifying device 60, the internal modifying device 61, and the separating device 62 are not limited to the shown example. For instance, instead of stacking the interface modifying device 60, the internal modifying device 61 and the separating device 62, at least one of them may be arranged adjacent to another in a horizontal direction.

The interface modifying device 60 as a first laser light radiator is configured to radiate laser light L1 for interface (for example, a $CO_2$ laser) as first laser light to the $SiO_2$ film as the insulating layer formed on the first wafer W, for example. As an example, the laser light L1 for interface has a wavelength equal to or larger than 5 μm, desirably, 9 μm to 10 μm. In the interface modifying device 60, the Si film positioned at a converging point of the laser light L1 for interface is modified to form a light leakage prevention layer M1 serving to suppress transmission of laser light L2 for inside to be described later.

Figure 3:
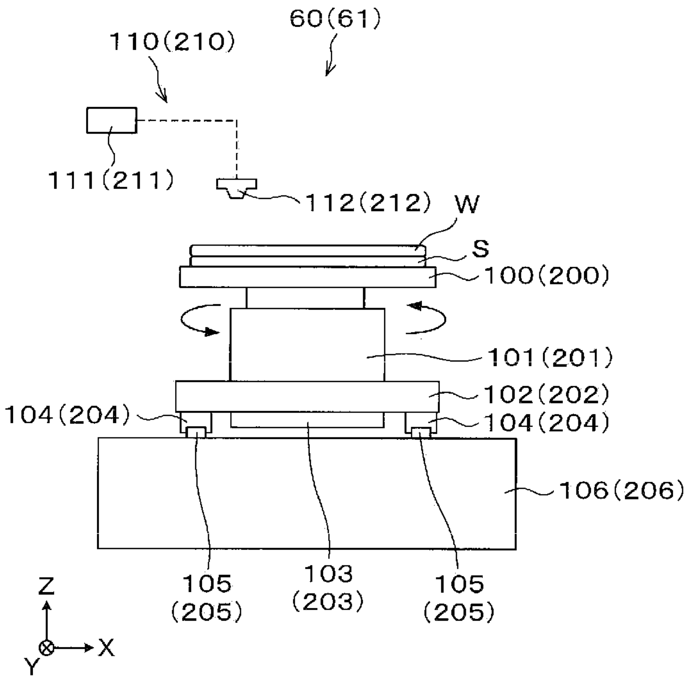
FIG. 3 is a front view schematically illustrating a configuration of an interface modifying apparatus according to the exemplary embodiment.

As depicted in FIG. 3, the interface modifying device 60 has a chuck 100 configured to hold the combined wafer T on a top surface thereof. The chuck 100 attracts and holds the surface of the second wafer S that is not bonded to the first wafer W.

The chuck 100 is supported on a slider table 102 with an air bearing 101 therebetween. A rotating mechanism 103 is provided on a bottom surface of the slider table 102. The rotating mechanism 103 has therein, for example, a motor as a driving source. The chuck 100 is configured to be rotatable around a 0 axis (vertical axis) by the rotating mechanism 103 via the air bearing 101. The slider table 102 is configured to be movable along a rail 105 extending in the Y-axis direction by a horizontally moving mechanism 104 provided on a lower surface thereof. The rail 105 is provided on a base 106. Further, although not particularly limited, a driving source of the horizontally moving mechanism 104 may be, by way of example, a linear motor.

Above the chuck 100, there is provided a laser radiation system 110. The laser radiation system 110 has a laser head 111 and a lens 112. The lens 112 may be configured to be movable up and down by an elevating mechanism (not shown).

The laser head 111 has a laser oscillator (not shown) configured to oscillate laser light in a pulse shape. That is, the laser light radiated from the laser radiation system 110 to the combined wafer T held by the chuck 100 is a so-called pulse laser, and its power is repeated between 0 (zero) and a maximum value. Further, the laser head 111 may have other devices, such as an amplifier.

The lens 112 is a cylindrical member, and is configured to radiate the laser light L1 for interface to the combined wafer T held by the chuck 100.

The internal modifying device 61 as a second laser light radiator is configured to radiate the laser light L2 for inside (for example, NIR light such as a YAG laser) as second laser light to an inside of the first wafer W. The laser light L2 for inside has a wavelength of, e.g. 1 μm to 1.5 μm. In the internal modifying device 61, the first wafer W positioned at a converging point of the laser light L2 for inside is modified to form an internal modification layer M2 serving as a starting point for separation of the first wafer W.

The internal modifying device 61 has the same configuration as the interface modifying device 60. That is, as shown in FIG. 3, the internal modifying device 61 includes a chuck 200 configured to hold the combined wafer T, an air bearing 201, a slider table 202, a rotating mechanism 203, a horizontally moving mechanism 204, a rail 205, a base 206, and a laser radiation system 210. In addition, the laser radiation system 210 has a laser head 211 and a lens 212. The laser radiation system 210 is configured to radiate the laser light L2 for inside to the combined wafer T held by the chuck 200.

The separating device 62 as a separator is configured to separate the first wafer W into a device wafer Wd1 and a separation wafer Wd2, starting from the internal modification layer M2 formed in the internal modifying device 61.

Figure 4:
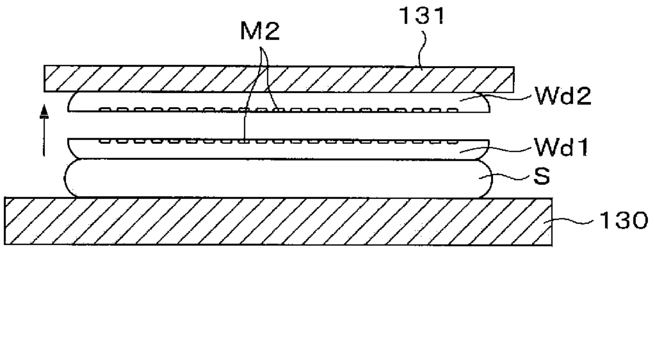
FIG. 4 is a front view schematically illustrating a configuration of a separating device.

As illustrated in FIG. 4, the separating device 62 has a chuck 130 configured to hold the second wafer S on a top surface thereof, and a separating arm 131 configured to hold the first wafer W on an attracting/holding surface thereof. As shown in FIG. 4, in the separating device 62, the second wafer S is held by the chuck 130, and the first wafer W is attracted to and held by the separating arm 131. In this state, by raising the separating arm 131, the first wafer W is separated. Here, however, the way to separate the first wafer W in the separating device 62 is not limited thereto, and can be selected as required.

The wafer transfer device 70 is disposed on the positive Y-axis side of the interface modifying device 60 and the internal modifying device 61, for example. The wafer transfer device 70 has, for example, two transfer arms 71 each configured to transfer the combined wafer T while attracting and holding the combined wafer T with a non-illustrated attracting/holding surface thereof. Each transfer arm 71 is supported by a multi-joint arm member 72, and is configured to be movable in a horizontal direction and a vertical direction and pivotable around a horizontal axis and a vertical axis. Also, the wafer transfer device 70 is configured to be able to transfer the combined wafer T and the like to the etching device 40, the cleaning device 41, the interface modifying device 60, the internal modifying device 61, the separating device 62, and the processing device 80 to be described later.

The processing device 80 is provided in the third processing block B3.

The processing device 80 has a rotary table 81. The rotary table 81 is configured to be rotatable about a vertical rotation center line 82 by a rotating mechanism (not shown). The two chucks 83 configured to attract and hold the combined wafer T is provided on the rotary table 81. The chucks 83 are evenly arranged on the same circumference as the rotary table 81. The two chucks 83 are configured to be moved to a delivery position A0 and a processing position A1 as the rotary table 81 is rotated. Further, each of the two chucks 83 is configured to be rotatable around a vertical axis by a rotating mechanism (not shown).

At the delivery position A0, a delivery of the combined wafer T is performed. A grinding device 84 is disposed at the processing position A1, and grinds the first wafer W while attracting and holding the second wafer S with the chuck 83. The grinding device 84 has a grinder 85 equipped with a grinding whetstone (not shown) configured to be rotatable in an annular shape. Additionally, the grinder 85 is configured to be movable in a vertical direction along a supporting column 86.

The above-described wafer processing system 1 has a control device 90. The control device 90 is, for example, a computer equipped with a CPU, a memory, and the like, and has a program storage (not shown). The program storage stores therein a program for controlling a processing of the combined wafer T in the wafer processing system 1. The program may have been recorded on a computer-readable recording medium H, and may be installed from the recording medium H into the control device 90.

Now, a wafer processing performed by using the wafer processing system 1 will be explained. Further, in the present exemplary embodiment, the combined wafer T is previously formed in a bonding device (not shown) outside the wafer processing system 1.

Figures 5A, 5B, 5C, 5D:
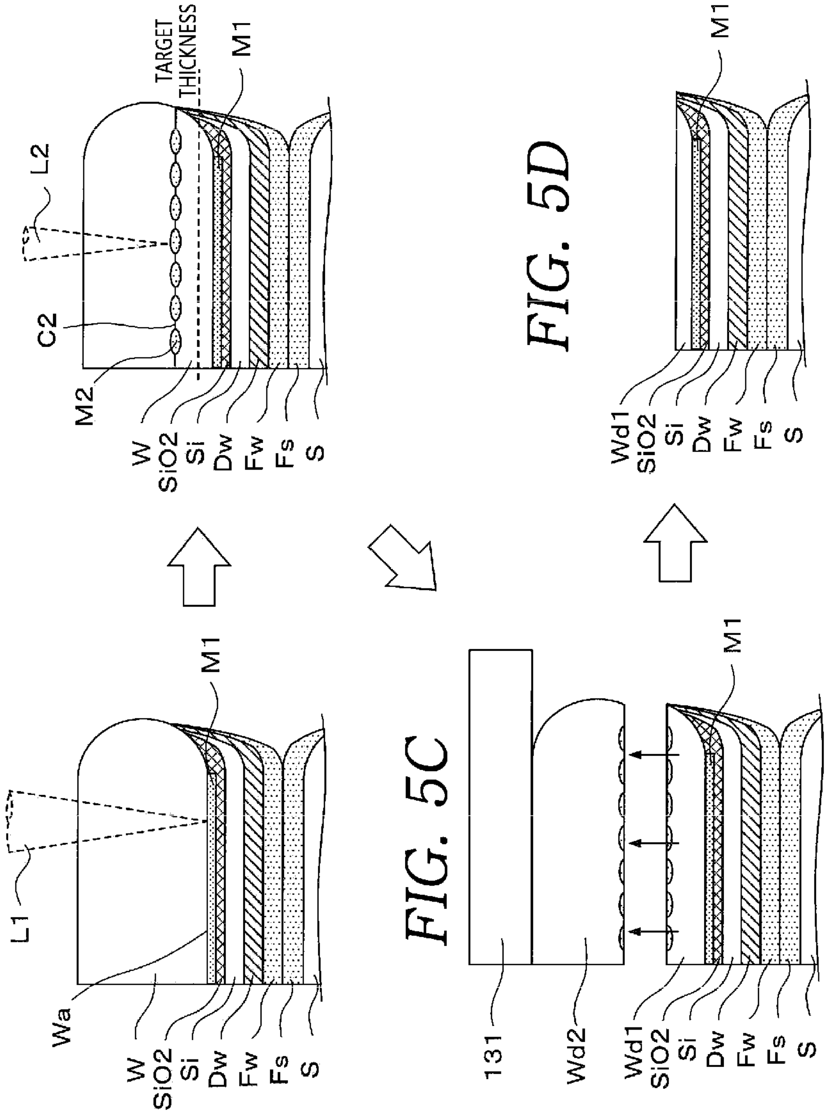
FIG. 5A to FIG. 5D are explanatory diagrams illustrating an example of main processes in a semiconductor wafer manufacturing process.

Furthermore, in the combined wafer T as a processing target according to the present exemplary embodiment, a $SiO_2$ film, a Si film, the device layer Dw, and the surface film Fw are stacked on the front surface Wa of the first wafer W, as shown in FIG. 1 and FIG. 5A.

First, the cassette T accommodating therein a plurality of combined wafers T is placed on the cassette placing table 10 of the carry-in/out station 2. Then, the combined wafer T is taken out from the cassette C by the wafer transfer device 20, and transferred to the transition device 30. The combined wafer T transferred to the transition device 30 is then transferred to the interface modifying device 60 by the wafer transfer device 50.

In the interface modifying device 60, the laser light L1 for interface is radiated to the $SiO_2$ film formed on the first wafer W, as shown in FIG. 5A. The radiated laser light L1 for interface is absorbed by the $SiO_2$ film, allowing the $SiO_2$ film to be modified to form the light leakage prevention layer M1 (process P1 of FIG. 6). Desirably, the light leakage prevention layer M1 is formed to cover the entire effective device surface that needs to be protected, when viewed from the top.

As an example, in the present exemplary embodiment, the temperature of the $SiO_2$ film is increased due to the absorption of the laser light L1 for interface ($CO_2$ laser), so that the temperature of the silicon constituting the first wafer W is increased, whereby a light absorption rate of the silicon is improved. Accordingly, the silicon absorbs the wavelength of the laser light L1 for interface ($CO_2$ laser), and is thus modified to form the light leakage prevention layer M1. In other words, the "modification" of the $SiO_2$ film in the interface modifying device 60 in the present exemplary embodiment includes the modification of the silicon constituting the first wafer W.

The combined wafer T having the light leakage prevention layer M1 formed therein is then transferred to the internal modifying device 61 by the wafer transfer device 50. In the internal modifying device 61, the internal modification layer M2 is formed inside the first wafer W (process P2 of FIG. 6), as shown in FIG. 5B.

In the formation of the internal modification layer M2, the laser light L2 for inside is periodically radiated from the laser radiation system 210 while rotating the combined wafer T (first wafer W), and, also, the radiation position of the laser light is moved inwards in a radial direction of the first wafer W. As a result, inside the first wafer W, the internal modification layer M2, which has a substantially spiral shape or concentric circle shape when viewed from the top, is formed in the entire surface of the first wafer W along a plane direction thereof. Here, the formation interval of the internal modification layer M2 in the radial direction may be set as required.

In addition, in forming the internal modification layer M2, by scanning and moving the radiation position of the laser light in a horizontal direction relative to the combined wafer T (first wafer W), the internal modification layer M2 may be formed in an approximately straight line shape.

Further, inside the first wafer W, a crack C2 develops along the formation direction of the internal modification layer M2, that is, along the plane direction of the first wafer W, as illustrated in FIG. 5B. It is desirable that the cracks C2 developing from each of the internal modification layers M2 formed adjacent to each other in the plane direction are connected to each other. The crack C2 developing from the internal modification layer M2 can be controlled by adjusting conditions such as, but not limited to, an output or a frequency of the laser light L2 for inside, a rotation speed of the combined wafer T, and so forth.

Here, the laser light L2 for inside radiated when forming the internal modification layer M2 is NIR light, and has transparency to silicon (Si). For this reason, there is a risk that some of the laser light L2 for inside radiated to the inside of the first wafer W may leak from the converging point (the position where the internal modification layer M2 is formed) and penetrate $SiO_2$ film to affect the device layer Dw.

In this regard, in the present exemplary embodiment, the light leakage prevention layer M1 is formed in the interface modifying device 60 prior to the formation of the internal modification layer M2. The formed light leakage prevention layer M1 absorbs or scatters a leak of the laser light L2 for inside (NIR light), so that the light leakage reaching the device layer Dw can be reduced, and the device layer Dw can be suppressed from being affected by the light leakage.

In addition, it is desirable that a lower end of the internal modification layer M2 formed inside the first wafer W is located above a target thickness (indicated by a dashed line in FIG. 5B) of the first wafer W after being subjected to grinding of a separation surface in a process P4, which will be described later, as illustrated in FIG. 5B.

The combined wafer T having the internal modification layer M2 formed therein is then transferred to the separating device 62 by the wafer transfer device 50.

In the separating device 62, starting from the internal modification layer M2 and the crack C2, the first wafer W is separated into the device wafer Wd1 on the front surface Wa side and the separation wafer Wd2 on the rear surface Wb side (process P3 of FIG. 6), as illustrated in FIG. 5C.

In the separation of the first wafer W in the process P3, the first wafer W is attracted to and held by the attracting/holding surface of the separating arm 131, and the second wafer S is attracted to and held by the chuck 130 (see FIG. 4). Afterwards, by raising the separating arm 131 in the state that the first wafer W is attracted to and held by the attracting/holding surface thereof, the first wafer W is separated into the device wafer Wd1 and the separation wafer Wd2. At this time, by rotating the chuck 130 and the separating arm 131 relative to each other or moving them relatively in a horizontally direction, a shear stress may be generated at a separation interface between the device wafer Wd1 and the separation wafer Wd2.

In addition, although the separation of the first wafer W is performed by using the separating arm 131 in the separating device 62 in the present exemplary embodiment, the separation of the first wafer W may be performed when the combined wafer T is transferred from the wafer transfer device 70 to the chuck 83 in the processing device 80. In this case, the processing device 80 functions as a "separator" according to the technique of the present disclosure.

The separation wafer Wd2 separated from the first wafer W is collected to the outside of the wafer processing system 1, for example. As another example, a collector (not shown) may be provided within a moving range of the transfer arm 71, and the separation wafer Wd2 may be collected by this collector.

The combined wafer T after being subjected to the separation of the first wafer W is then transferred to the chuck 83 of the processing device 80 by the wafer transfer device 70. Next, the chuck 83 is moved to the processing position A1, and the separation surface of the device wafer Wd1 is ground by the grinding device 84 (process P4 of FIG. 6), as illustrated in FIG. 5D. Through this grinding processing, the internal modification layer M2 remaining on the separation surface of the device wafer Wd1 is removed, and the device wafer Wd1 can be thinned to a required thickness.

At this time, as stated above, since the internal modification layer M2 is formed with its lower end located above the target thickness (height position of the final thickness) of the first wafer W after being ground, the internal modification layer M2 remaining on the separation surface can be appropriately removed by the grinding.

Figure 6:
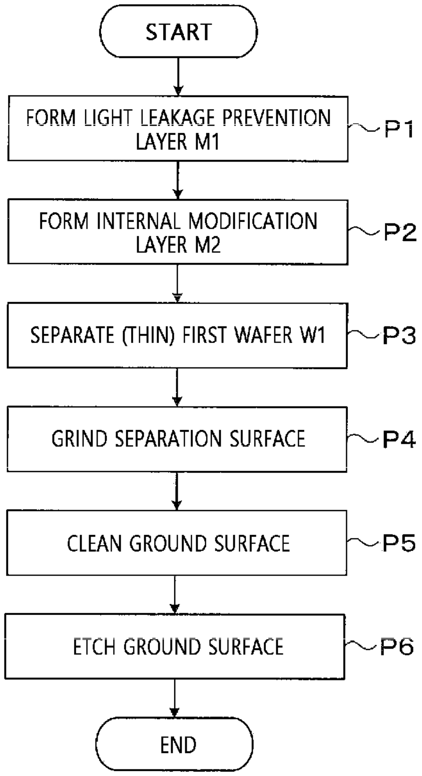
FIG. 6 is a flowchart illustrating an example of the main processes in the semiconductor wafer manufacturing process.

The combined wafer T in which the first wafer W is thinned to the target thickness in the processing device 80 is then transferred to the cleaning device 41 by the wafer transfer device 70, and the ground surface of the device wafer Wd1 is cleaned (process P5 of FIG. 6).

Subsequently, the combined wafer T is transferred to the etching device 40 by the wafer transfer device 50, and the ground surface of the device wafer Wd1 is wet-etched by a chemical liquid (process P6 of FIG. 6). In the process P6, by performing the wet-etching processing on the ground surface of the device wafer Wd1 as stated above, the ground surface is flattened.

Thereafter, the combined wafer T after being subjected to all the required processes is transferred to the transition device 30 by the wafer transfer device 50, and then transferred to the cassette C on the cassette placing table 10 by the wafer transfer device 20. In this way, the series of processes of the wafer processing in the wafer processing system 1 are completed.

Furthermore, the combined wafer T after being subjected to all the required processes may be further subjected to a CMP (Chemical Mechanical Polishing) processing to flatten the ground surface. This CMP processing may be performed outside or inside the wafer processing system 1. When performing the CMP processing inside the wafer processing system 1, a CMP device configured to perform the CMP processing may be stacked with the etching device 40 and the cleaning device 41 in the first processing block B1, for example.

According to the above-described exemplary embodiment, prior to forming the internal modification layer M2, the $SiO_2$ film provided between the first wafer W and the device layer Dw is modified to form the light leakage prevention layer M1 configured to absorb or scatter the light leakage of the laser light L2 for inside. Accordingly, even if the laser light L2 for inside (NIR light) having transmittance to silicon is radiated in forming the internal modification layer M2, the light leakage of the laser light L2 for inside is suppressed from reaching the device layer Dw, so that any influence on the device layer Dw may be suppressed.

Further, according to the above-described exemplary embodiment, by forming the light leakage prevention layer M1 in this way, the position of the light converging point inside the first wafer W (the position where the internal modification layer M2 is formed) can be brought closer to the device layer Dw. Thus, a grinding amount in the grinding processing (process P4) as a post-process can be reduced.

Specifically, the amount of the laser light L2 for inside transmitted to the device layer Dw when forming the internal modification layer M2 increases as the position of the converging point of the laser light L2 for inside approaches the device layer Dw. In this regard, in the present exemplary embodiment, even when the position of the converging point of the laser light L2 for inside (the formation position of the internal modification layer M2) is brought close to the device layer Dw, the light leakage that is about to be transmitted to the device layer Dw can be absorbed and scattered by the light leakage prevention layer M1. Therefore, the position of the converging point of the laser light L2 for inside can be brought close to the device layer Dw (more specifically, the position of the target thickness in the grinding processing), so the grinding amount in the grinding processing (process P4) can be reduced.

Further, in the above-described exemplary embodiment, although the combined wafer T obtained after the first wafer W is separated is subjected to the grinding processing (process P4), the cleaning of the ground surface (process P5), and the wet etching processing (process S6) in sequence, the grinding processing on the combined wafer T can be appropriately omitted when the position of the converging point of the laser light L2 for inside can be brought close enough to the device layer Dw as described above. That is, although the grinding processing in the above-described process P4 is aimed at reducing the device wafer Wd1 to the required target thickness, the grinding processing of the process P4 can be omitted if the internal modification layer M2 can be formed near the required target thickness position and the first wafer W can be separated near the target thickness position.

In this case, the internal modification layer M2 remaining on the separation surface of the device wafer Wd1 can be removed by the wet etching processing that is performed on the combined wafer T without performing the grinding processing. Further, in this wet etching processing, the separation surface of the combined wafer T is flattened.

In addition, the separation surface of the combined wafer T that has been flattened by the wet etching processing may be further smoothed by the CMP processing as stated above.

Moreover, in the above-described exemplary embodiment, the crack C2 developing in the plane direction from the internal modification layer M2 is made to reach an outer peripheral end of the first wafer W, as illustrated in FIG. 5B. In this case, however, the peripheral portion We of the device wafer Wd1 after being subjected to the removal of the separation wafer Wd2 becomes to have a sharply pointed shape (so-called knife edge shape), as shown in FIG. 5C. Then, there is a risk that chipping may occur at the peripheral portion We of the wafer, causing damage to the wafer.

In view of this, in the wafer processing system 1 according to the present exemplary embodiment, in order to suppress the formation of this knife edge shape at the peripheral portion We, the peripheral portion We of the first wafer W may be removed as one body with the separation wafer Wd2 (so-called edge trimming). That is, the processing device 80 or the separating device 62 serving to separate the first wafer W may function as a periphery removing device configured to remove the peripheral portion We of the first wafer W.

Figures 7A, 7B, 7C, 7D:
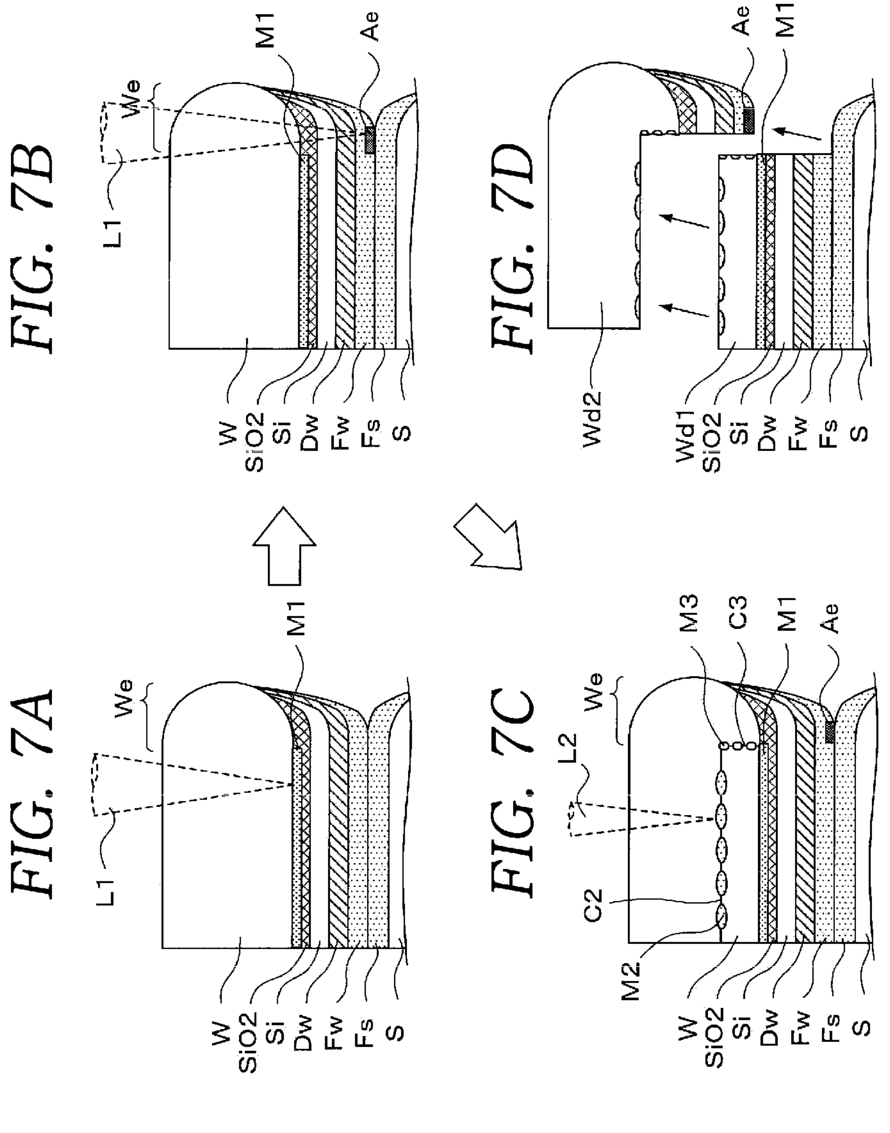
FIG. 7A to FIG. 7D are explanatory diagrams illustrating an example of other processes in the semiconductor wafer manufacturing process.

Specifically, as shown in FIG. 7A, the $SiO_2$ film is first modified in the interface modifying device 60 to form the light leakage prevention layer M1, the same as in the above-described exemplary embodiment.

Once the light leakage prevention layer M1 is formed, the focal position of the laser light L1 for interface ($CO_2$ laser) is changed to the device layer Dw or the surface film Fw (in the shown example, the surface film Fw) at the peripheral portion We of the first wafer W, as shown in FIG. 7B, to form a non-bonding region Ae in which bonding strength between the first wafer W and the second wafer S is reduced. For example, the non-bonding region Ae is formed by amorphizing or removing the portion radiated with the laser light L1 for interface.

Once the non-bonding region Ae is formed, the internal modification layer M2 and a peripheral modification layer M3 are sequentially formed in the internal modifying device 61, as shown in FIG. 7C. The peripheral modification layer M3 serves as a starting point for the separation (edge trimming) of the peripheral portion We. The order for forming the internal modification layer M2 and the peripheral modification layer M3 is not particularly limited. At this time, the crack C2 develops from the internal modification layer M2 along the plane direction of the first wafer W, and, also, a crack C3 develops from the peripheral modification layer M3 along a thickness direction of the first wafer W. Further, a radially outer end of the crack C2 is connected to an upper end of the crack C3 or the peripheral modification layer M3 formed at the uppermost position (rear surface Wb side of the first wafer W) within the first wafer W, as illustrated in FIG. 7C. In other words, the crack C2 does not extend to an edge portion of the first wafer W. Further, the crack C3 does not extend to the rear surface Wb of the first wafer W.

Then, as shown in FIG. 7D, the first wafer W is separated into the device wafer Wd1 and the separation wafer Wd2 to be thinned, starting from the internal modification layer M2, the peripheral modification layer M3, and the cracks C2 and C3 formed inside the first wafer W.

In the example shown in FIG. 7A to FIG. 7D, by removing the peripheral portion We of the first wafer W as one body with the separation wafer Wd2, the formation of the knife edge shape at the peripheral portion of the device wafer Wd1 can be suppressed.

Furthermore, although the light leakage prevention layer M1 and the non-bonding region Ae are formed in this order in the example shown in FIG. 7A to FIG. 7D, the non-bonding region Ae may be formed before forming the light leakage prevention layer M1.

In addition, although the exemplary embodiment shown in FIG. 5A to FIG. 5D or FIG. 7A to FIG. 7D has been described for the example where the combined wafer T to be processed has the first wafer W on which the $SiO_2$ film, the Si film, the device layer Dw, and the surface film Fw are stacked on the front surface Wa side thereof, the $SiO_2$ film of the first wafer W may be an oxygen-doped silicon layer formed as a part of the thickness of the first wafer W is modified by doping of oxygen ($O_2$).

Hereinafter, a description will be provided for a case where the combined wafer T has the first wafer W in which an oxygen-doped silicon layer as the $SiO_2$ film is formed.

Figures 8A, 8B, 8C, 8D:
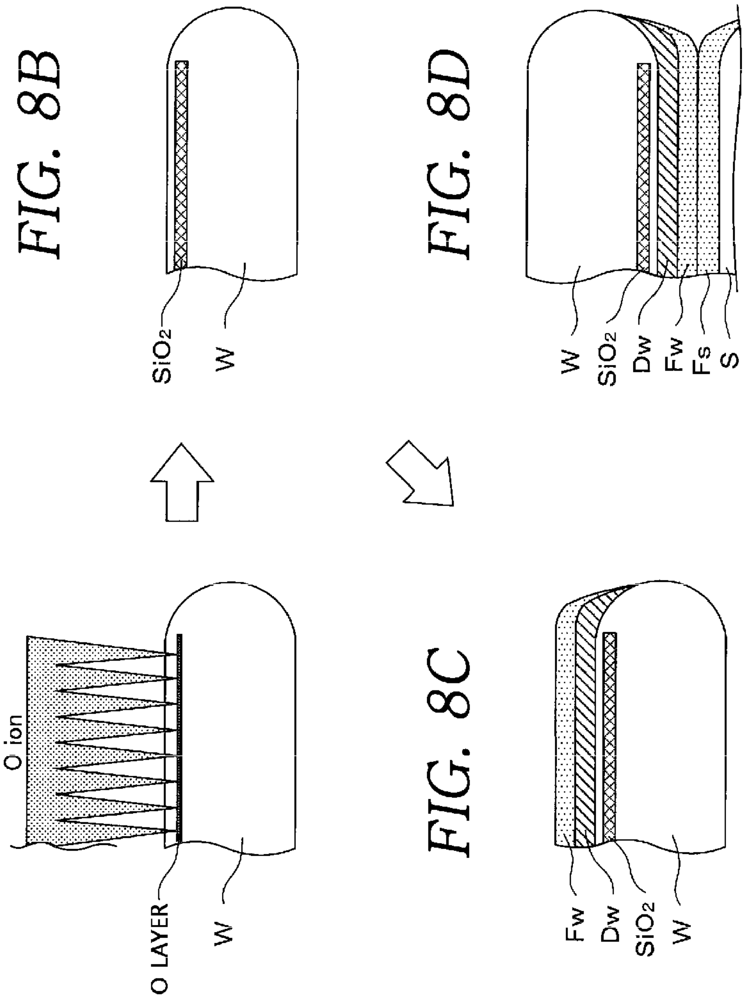
FIG. 8A to FIG. 8D are explanatory diagrams illustrating an example of an oxygen-containing film forming process on a first wafer.

To form the oxygen-doped silicon layer in the first wafer W, first, a high-concentration of oxygen (O) ions are implanted near the front surface Wa of the first wafer W, as shown in FIG. 8A, so that a $SiO_2$ layer as an insulating layer is formed as illustrated in FIG. 8B. At this time, the $SiO_2$ layer is formed at a position in a thickness direction of the first wafer W into which the O ions are implanted. As a result, an SOI structure in which the single crystalline silicon layer and the $SiO_2$ layer as the insulating layer are arranged in the thickness direction is formed in the first wafer W. Further, the implantation position (height within the first wafer W in the thickness direction) of the oxygen ions may be appropriately adjusted to a required position. This implantation position is set to be closer to the front surface Wa than a position where the internal modification layer M2 is to be formed in the internal modifying device 61.

Further, the way to form the $SiO_2$ layer in the first wafer W is not limited to the above-describe example. By way of example, instead of implanting the high-concentration oxygen ions, a high concentration of carbon (C) ions may be implanted near the front surface Wa of the first wafer W, and the first wafer W having the carbon ions implanted therein is subjected to a heat treatment (annealing processing) at a high temperature to form an oxygen precipitation layer.

Once the $SiO_2$ layer is formed inside the first wafer W, the device layer Dw and the surface film Fw are sequentially formed on the front surface Wa side of the first wafer W, as shown in FIG. 8C. The device layer Dw includes a plurality of devices. The surface film Fw is, by way of non-limiting example, a TEOS film.

Next, as shown in FIG. 8D, the first wafer W and the second wafer S are bonded to form a combined wafer T. The first wafer W and the second wafer S are bonded to each other via surface films Fw and Fs, respectively.

Figures 9A, 9B, 9C, 9D:
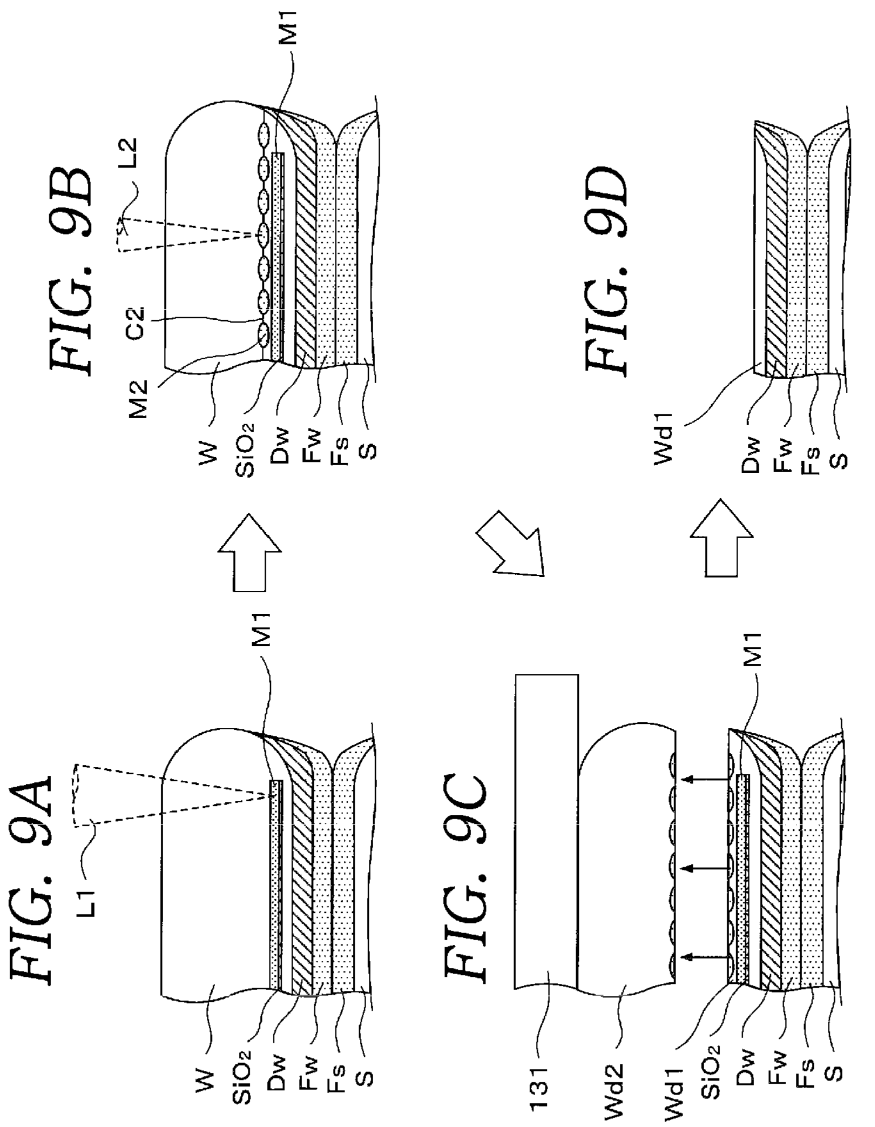
FIG. 9A to FIG. 9D are explanatory diagrams illustrating an example of other processes in the semiconductor wafer manufacturing process.

The combined wafer T formed as described above is then brought into the wafer processing system 1. The combined wafer T brought into the wafer processing system 1 is first transferred to the interface modifying device 60 and, as shown in FIG. 9A, by radiating the laser light L1 for interface to the $SiO_2$ layer formed in the first wafer W, the $SiO_2$ layer is modified to form a light leakage prevention layer M1.

Next, the combined wafer T having the light leakage prevention layer M1 formed therein is transferred to the internal modifying device 61. As shown in FIG. 9B, as the laser light L2 for inside is radiated to the inside of the first wafer W, the internal modification layer M2 serving as a starting point for separation of the first wafer W is formed. Also, the crack C2 develops from the internal modification layer M2 in the plane direction of the first wafer W.

At this time, since the light leakage prevention layer M1 is formed between the device layer Dw and the formation position of the internal modification layer M2 within the combined wafer T, it is possible to appropriately suppress the device layer Dw from being affected by a light leakage in the radiation of the laser light L2 for inside. Further, since the light leakage prevention layer M1 is formed in this way, the formation position of the internal modification layer M2 (the position of the converging point of the laser light L2 for inside) can be brought close to the device layer Dw, as illustrated in FIG. 9B.

The combined wafer T having the internal modification layer M2 formed therein is then transferred to the separating device 62. In the separating device 62, as illustrated in FIG. 9C, the first wafer W is separated into the device wafer Wd1 and the separation wafer Wd2, starting from the internal modification layer M2 and the crack C2. Further, the device wafer Wd1 after being separated from the first wafer W may be transferred to the cleaning device 41, and the separation surface may be cleaned.

Here, in the combined wafer T according to the present exemplary embodiment, the formation position of the internal modification layer M2 (the position of the converging point of the laser light L2 for inside) may be brought close to the device layer Dw. In other words, in the processing device 80, the grinding amount of the first wafer W after being separated can be reduced or eliminated.

Thus, in the present exemplary embodiment, the device wafer Wd1 after being separated from the first wafer W is transferred not to the processing device 80 but to the etching device 40. That is, in the present exemplary embodiment, an etching processing (removal of the internal modification layer M2 and flattening) may be performed on the separation surface of the combined wafer T (device wafer Wd1) after being thinned by the separation, as illustrated in FIG. 9D, without performing the grinding processing in the processing device 80.

In addition, in this etching processing, the $SiO_2$ layer and the light leakage prevention layer M1 formed inside the first wafer W may be further removed, as shown in FIG. 9D.

Afterwards, the combined wafer T after being subjected to all the required processes is taken out from the wafer processing system 1. In this way, the series of processes of the wafer processing in the wafer processing system 1 are completed.

In addition, the combined wafer T after being subjected to all the required processes may be further subjected to a CMP processing (smoothing processing) inside or outside the wafer processing system 1.

As stated above, the structure of the combined wafer T to be processed in the wafer processing system 1 is not particularly limited, and the $SiO_2$ film as the oxygen-containing film may be formed on the front surface Wa of the first wafer W, or the $SiO_2$ layer as the oxygen-containing film may be formed inside the first wafer W.

In any case, by forming the light leakage prevention layer M1 prior to the formation of the internal modification layer M2 inside the first wafer W, the device layer Dw can be appropriately prevented or suppressed from being affected by the light leakage.

Further, in the example shown in FIG. 9A to FIG. 9D, the etching processing is performed on the combined wafer T without performing the grinding processing. However, depending on the formation position of the internal modification layer M2 within the first wafer W, that is, depending on the position of the separation surface of the first wafer W, the grinding processing may be appropriately performed.

Moreover, in the above-described exemplary embodiment, although the interface modifying device 60 configured to form the light leakage prevention layer M1 and the internal modifying device 61 configured to form the internal modification layer M2 (and the peripheral modification layer M3) are arranged independently, these laser radiating devices may be configured as one body.

Figure 10:
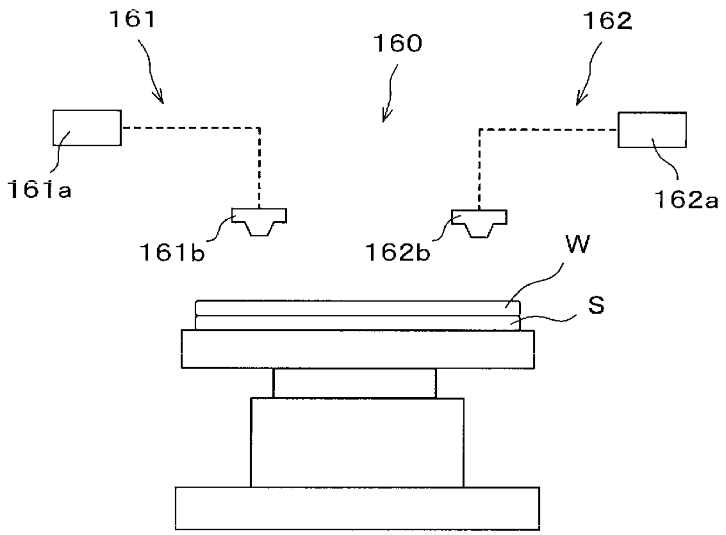
FIG. 10 is a longitudinal cross sectional view illustrating a configuration example of a laser radiating device.

That is, as shown in FIG. 10, for example, one laser radiating system 161 configured to radiate the laser light L1 for interface ($CO_2$ laser) and another laser radiating system 162 configured to radiate the laser light L2 for inside (NIR light) may be disposed inside a single laser radiating device 160. The one laser radiating system 161 includes a laser head 161*a* and a lens 161*b*. The other laser radiating system 162 includes a laser head 162*a* and a lens 162*b*.

At this time, the one laser radiating system 161 and the other laser radiating system 162 may be arranged independently as shown in FIG. 10. Alternatively, although not shown, the one laser radiating system 161 and the other laser radiating system 162 may be integrated, and the radiation of the laser light L1 for interface and the laser light L2 for inside may be switchable under the control of the control device 90.

In addition, when the interface modifying device 60 and the internal modifying device 61 are integrated in this way, the radiation of the laser light L1 for interface to the $SiO_2$ film and the radiation of the laser light L2 for inside to the inside of the first wafer W may be performed simultaneously.

More specifically, the laser light L1 for interface is radiated to the $SiO_2$ film while moving the lens 161*b*, and the laser light L2 for inside is radiated while moving the lens 162*b* to catch up with the radiation of the laser light L1 for interface to the $SiO_2$ film. That is, in the above-described exemplary embodiment, the internal modification layer M2 is formed after the light leakage prevention layer M1 is formed on the entire surface of the first wafer W. However, the laser light L2 for inside may be radiated to a position corresponding to the light leakage prevention layer M1 immediately after the light leakage prevention layer M1 is formed.

In this case, it is desirable that an output of the laser light L2 for inside or a relative distance between a radiation axis of the laser light L1 for interface and a radiation axis of the laser light L2 for inside is controlled such that the crack C2 that develops when forming the internal modification layer M2 should not reach a position directly below where the laser light L1 for interface is radiated.

Thus, since the formation of the light leakage prevention layer M1 and the formation of the internal modification layer M2 can be performed approximately at the same time as stated above, the time required for the series of processes for the combined wafer T in the wafer processing system 1 can be significantly shortened.

In addition, although the above exemplary embodiment has been described for the example where the laser light L1 for interface is the $CO_2$ laser and the laser light L2 for inside is the NIR light, the kind of the laser light is not particularly limited as long as the light leakage prevention layer M1 and the internal modification layer M2 can be formed appropriately.

In addition, although the above exemplary embodiment has been described for the example where the wafer as a processing target is the SIO wafer (for example, a SIMOX wafer), the structure of the wafer is not particularly limited.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to appropriately thin the first substrate in the combined substrate in which the first substrate and the second substrate are bonded to each other.

We claim:

1. A substrate processing method of processing a combined substrate in which a first substrate and a second substrate are bonded to each other, wherein a device layer including multiple devices is formed on a front surface side of the first substrate, and wherein the substrate processing method comprises:

forming a light leakage prevention layer by radiating first laser light to an oxygen-containing film formed between the device layer and a position where a modification layer serving as a starting point for separation of the first substrate is formed;

forming the modification layer by radiating second laser light to an inside of the first substrate after the forming of the light leakage prevention layer; and separating the first substrate starting from the modification layer to thin the first substrate.

2. The substrate processing method of claim 1, wherein the combined substrate is a SIMOX substrate in which a single crystalline semiconductor layer and an insulating layer are stacked on top of each other.

3. The substrate processing method of claim 1, wherein the light leakage prevention layer is an oxygen-doped silicon layer formed as a part of a thickness of the first substrate is modified by doping of oxygen.

4. The substrate processing method of claim 1, wherein the light leakage prevention layer is an oxide film formed to coat an outer surface of the first substrate.

5. The substrate processing method of claim 1, wherein a lower end of the modification layer is located above a height position of a target thickness of the first substrate.

6. The substrate processing method of claim 1, wherein in the separating of the first substrate, a peripheral portion of the first substrate is separated as one body with a rear surface side of the first substrate as a removal target.

7. The substrate processing method of claim 6, further comprising:

forming the light leakage prevention layer in a central portion radially inner side than the peripheral portion of the first substrate as the removal target; and forming, in a portion corresponding to the peripheral portion, a non-bonding region in which bonding strength between the first substrate and the second substrate are reduced.

8. The substrate processing method of claim 1, further comprising:

flattening a separation surface of the combined substrate after being thinned, without performing a grinding processing; and polishing the separation surface of the combined substrate after being subjected to the flattening of the separation surface.

9. A substrate processing apparatus of processing a combined substrate in which a first substrate and a second substrate are bonded to each other, wherein a device layer including multiple devices is formed on a front surface side of the first substrate, and wherein the substrate processing apparatus comprises:

a first laser light radiator configured to form a light leakage prevention layer by radiating first laser light to an oxygen-containing film formed between the device layer and a position where a modification layer serving as a starting point for separation of the first substrate is formed;

a second laser light radiator configured to form the modification layer by radiating second laser light to an inside of the first substrate after the light leakage prevention layer is formed; and a separator configured to separate the first substrate starting from the modification layer to thin the first substrate.

10. The substrate processing apparatus of claim 9, wherein the first laser light radiator and the second laser light radiator are integrated.

11. The substrate processing apparatus of claim 9, further comprising:

a controller and a program storage including a program, wherein the program storage and the program are configured, with the controller, to perform a control of forming the modification layer such that a lower end of the modification layer is located above a height position of a target thickness of the first substrate.

12. The substrate processing apparatus of claim 9, further comprising:

a periphery removing device configured to remove a peripheral portion of the first substrate.

13. The substrate processing apparatus of claim 12, further comprising:

a controller and a program storage including a program, wherein the periphery removing device is integrated with the separator, and in the separation of the first substrate, the program storage and the program are configured, with the controller, to perform a control of separating the peripheral portion of the first substrate as one body with a rear surface side of the first substrate as a removal target.

14. The substrate processing apparatus of claim 12, further comprising:

a controller and a program storage including a program, wherein the program storage and the program are configured, with the controller, to perform:

a control of forming the light leakage prevention layer in a central portion radially inner side than the peripheral portion of the first substrate as a removal target; and a control of forming, in a portion corresponding to the peripheral portion, a non-bonding region in which bonding strength between the first substrate and the second substrate is reduced.

15. The substrate processing apparatus of claim 9, wherein the combined substrate is a SIMOX substrate in which a single crystalline semiconductor layer and an insulating layer are stacked on top of each other.

16. The substrate processing apparatus of claim 9, wherein the light leakage prevention layer is an oxygen-doped silicon layer formed as a part of a thickness of the first substrate is modified by doping of oxygen.

17. The substrate processing apparatus of claim 9, wherein the light leakage prevention layer is an oxide film formed to coat an outer surface of the first substrate.

* * * * *